United States Patent [19]
Shiga et al.

[11] Patent Number: 4,529,667
[45] Date of Patent: Jul. 16, 1985

[54] SILVER-COATED ELECTRIC COMPOSITE MATERIALS

[75] Inventors: Shoji Shiga, Utsunomiya; Satoshi Suzuki; Nariyoshi Kiso, both of Nikko, all of Japan

[73] Assignee: The Furukawa Electric Company, Ltd., Tokyo, Japan

[21] Appl. No.: 482,536

[22] Filed: Apr. 6, 1983

[51] Int. Cl.³ .............................................. B32B 15/00
[52] U.S. Cl. ..................... 428/646; 428/647; 428/648; 428/669; 428/670; 428/671; 428/673; 428/666; 428/680; 428/675; 428/657
[58] Field of Search ............... 428/669, 680, 673, 666, 428/660, 674, 661, 657, 671, 675, 646, 648, 647

[56] References Cited

U.S. PATENT DOCUMENTS 3,443,914  5/1969  Hagashi ............................. 428/648
3,457,539  7/1969  Lupfer ................................ 428/669
3,648,355  3/1972  Shida et al. ....................... 428/669
4,441,118  4/1984  Fister et al. ........................ 357/70

FOREIGN PATENT DOCUMENTS 1564069  3/1966  Fed. Rep. of Germany ...... 420/501
2040463  8/1970  Fed. Rep. of Germany ...... 428/673
   6818  1/1976  Japan ................................. 428/669
 139173 12/1978  Japan ................................. 428/673
 123394  9/1981  Japan ................................. 428/648

Primary Examiner—L. Dewayne Rutledge
Assistant Examiner—Christopher W. Brody
Attorney, Agent, or Firm—Oblon, Fisher, Spivak, McClelland & Maier

[57] ABSTRACT

A silver-coated electric material wherein a partial or total surface of an electroconductive or non-electroconductive substrate is provided with a coating of silver or silver alloy, having the first intermediate coating layer made of Ni, Co, Cr, Pd or their alloys and the second intermediate coating layer made of Sn, Cd, Pd, Ru or their alloys between the silver coating and the surface of the substrate, and the method of preparing the same.

7 Claims, No Drawings

SILVER-COATED ELECTRIC COMPOSITE MATERIALS

THE DETAILED DESCRIPTION OF THE INVENTION

This invention relates to a silver-coated electric material which is excellent in electrical connecting property, metallurgical joining property (soldering and bonding property) and corrosion-resistance.

The silver-coated electric material wherein the partial or total surface of electroconductive substrate such as of copper, copper alloys, nickel, nickel alloys, iron and iron alloys, aluminum, aluminum alloys, etc. or that of non-electroconductive substrate such as of ceramics, plastics, etc. is provided with a coating of silver or silver alloy, for example, Ag—Au, Ag—Sb, Ag—In, Ag—Cu, Ag—Se, Ag—Pt, etc. is widely available for an electric or electronic material.

Silver, excellent in electroconductivity and corrosion-resistance, but is high-priced because it is a precious metal. Therefore, there is a demand that silver should be employed only in parts where the excellent electric characteristics are particularly needed, and the silver-coated electric material appeared according to this demand. Then, it is obvious from the economical standpoint that the silver coating should be as thin as possible.

As an example of the above-mentioned electric material composed of substrate coated with silver being employed as an electric and electronic material, the lead frame of semi-conductors is provided with silver coating only at the mounting part where at least a silicon chip is attached or at a part where an Au wire is subjected to wire-bonding. The silver-coated electric material is also used for electric contacts such as switch, relay, connector, etc., lead wires and terminals for various electronic parts, furthermore electrical cable conductors for electric instruments and aeroplanes.

Silver-coated materials, in which only a part of substrate surface is provided with silver-coating by means of selective plating, are widely used for various applications. In other words, the electric material of substrate with silver coating which is the object of this invention, is widely used for applications in which excellent metallurgical joining property such as soldering property and bonding property is demanded, and for applications, such as electric contacts, in which excellent electrical connecting property is demanded, by utilizing the physical and chemical properties peculiar to silver.

Such applications naturally demand that the silver-coated electric material does not deteriorate in the properties during a long period of practical use or lose its characteristics through thermal and chemical treatments to which it is subjected in the production of parts using it. It is said that in order for the silver-coated electric material to exhibit its original properties to meet such requirements, the thickness of the silver coating must be at least 1 μm, usually 3–6 μm.

As silver is expensive, however, the demand for thinner silver coating is becoming stronger.

However, when the silver coating is made thin for cost reduction, the following problems arise.

(1) Although depending on the methods and conditions of preparing the silver-coated electric material, the silver coating becomes porous and therefore the substrate is liable to emerge from under the coating, because of occurrence of the so-called pin-hole.

(2) In the case of the electroconductive substrate, less noble metals contained in the substrate play a solid phase diffusion-reaction into the silver coating and reach the outer most part of the silver coating to be oxidized. As a result, the resulting corrosive products become easy to accumulate on the surface of the electric material. This phenomenon remarkably appears in case the electric material is exposed to a high temperature, because the solid phase diffusion-reaction proceeds according to the exponential kinetics velocity as to the temperature.

Although the above two problems also appear more remarkably in gold-coated electric material wherein gold which is more expensive than silver is employed, they can be solved by making an intermediate layer of Ni between the substrate and the gold coating.

In the silver-coated electric material also, the making of Ni intermediate layer is practically used in case of semi-conductive lead frames and electric contacts uses. The occurrence of the pin-hole and the solid phase diffusion of the substrate into the silver coating is prevented by making the Ni intermediate layer of usually 0.5 to 3 μm in thickness. However, even if the Ni intermediate layer like this is provided, it can not be solution to the problem in case the silver coating of the silver-coated electric material is made further thinner and in case the electric material is exposed to high temperature in the process of making parts.

For example, electronic parts for which silver-coated electric materials are used most as component materials are assembled by soldering such electric materials, and these electronic parts themselves are generally mounted on printed circuit boards by soldering.

Therefore, in these cases the electric material is exposed to high temperature. It is further exposed to high temperatures in resin-molding and curing, and in the processes to control its properties, such as aging, drying, evaporation, spattering etc. In many cases, these processes are usually carried out at, temperatures of 150° C. to 400° C.

One of the merits in the use of the silver-coated electric material is that it can be given various processes in a high-temperature atmosphere. The presence of oxygen is even mandatory in part of resin-curing. When the silver-coated electric material is subjected to treatments in the presence of such a high temperature oxygen, the Ni intermediate layer in the electric material can not solve the problems, and the soldering property of the electric material is extremely depressed, and, in some cases, the silver coating comes off. This is the problem proper to the silver-coated electric material which can not be recognized in Au-coated electric material, and as the result of our elaborate study we have found that it is due to the following reasons.

(1) At temperatures of 150° C. to 400° C. or higher, oxygen in the surrounding atmosphere penetrates the silver coating layer rapidly, reaches the surface of nickel intermediate layer under the silver coating, and causes an oxidation-reaction with Ni. The penetrating oxygen is assumed to be in the atomic state, and therefore particularly active. As a result, the surface of nickel intermediate layer is covered with nickel oxide (NiO) to cut off the metallic bond between silver and nickel, and then the close adhesiveness of the silver coating and nickel intermediate layer is lost, thereby causing the silver coating to come off.

(2) Silver is a metal that dissolves into the soldering bath most rapidly, and it dissolves by 2-3 μm in thickness per second under normal soldering conditions. Therefore, in case the silver coating is thin, nickel oxide, formed as above-mentioned, emerge from the surface of silver-coated electric material and deteriorates the soldering property of the electric material.

This invention concerns the silver-coated electric materials and the method of preparing the same developed under the above circumstances.

The objects of this invention are as follows.

As the silver-coated electric material, it should have the following characteristics.

1. Sufficient corrosion-resistance to prevent effectively corrosion of substrate even in case of thin silver coating.
2. Superior in corrosion-resistance to the conventional silver-coated electric material in an environment of sulfides or the like.
3. Excellent adhesion of silver coating and no separation of the coating when exposed to high temperature.
4. No diffusion of the substrate into the silver coating even at high temperature and no deterioration of the properties of the coating such as conductivity and corrosion-resistance.
5. A high level of metallurgical joining properties such as soldering property retained not only in a non-oxidizing atmosphere but also in an oxidizing and high-temperature atmosphere.
6. A high level of electric connecting properties such as contact resistance maintained even in storage for a long period.
7. Low in the susceptability to silver migration which is one of the main defects of silver. (Note): Silver Migration is a phenomenon in which Ag ions migrate from silver conductor of a plus side to deposit and grow on a minus side between which insulating material intervenes under direct electrical field, so to cause short circuit.
8. Being high in mechanical strength of the silver coating and being excellent in wear-resistance.

As to the method of preparing the same, we have found a method for efficient, commercial production of silver-coated electric materials which satisfy the above-mentioned characteristics.

In order to achieve the above objects, this invention has adopted the following constitutions.

The first invention thereof relates to a silver-coated electric material wherein a partial or total surface of an electroconductive or non-electroconductive substrate is provided with a coating of silver or silver alloy, characterized by that the first intermediate coating made of at least one selected from the group consisting of Ni, Co, Cr, Pd and the alloys thereof and the second intermediate coating made of at least one selected from the group consisting of Sn, Cd, Pd, Ru and the alloys thereof are layered between the substrate and the silver coating in that order from the substrate to the silver coating.

The second invention thereof relates to a method of preparing the silver-coated electric material, wherein, in case the substrate in the first invention is particularly electroconductive, three layers of the first intermediate coating, the second intermediate coating and the silver coating on the substrate are formed successively by electroplating.

By adopting the constitution like this in the first invention, the silver-coated electric material is improved in metallurgical joining properties (soldering property, bonding property), electrical connecting property, corrosion-resistance and further wear-resistance thereof, and the susceptibility to silver migration thereof is also lowered.

In case the substrate is made of Ni, Co, Cr, Pd or the alloys thereof or in case the layer of Ni, Co, Cr, Pd or the alloys thereof is pre-formed on the surface of the substrate, it is obvious from the constitution of this invention that the first intermediate coating can be replaced by the substrate.

The reason why the above constitution is selected as the first intermediate coating is that Ni, Co, Cr and Pd are metals having high melting points and do not react with silver at all or in the practical condition and that these metals are difficult to react with the substrate materials such as copper and copper alloys which are most conventional and are used most as substrates. Particularly, Cr acts effectively as a barrier to the copper-substrate, but it is generally hard and brittle, and therefore it should not be used for applications which require an excessive thickness or workability.

A preferable first intermediate coating is one that contains at least total 10% of one or more than one of four metals—Ni, Co, Cr and Pd because the content of less than 10% do not exhibit a remarkable effect for preventing the substrate to diffuse into the silver coating. Examples of the alloys thereof are Ni—Co, Ni—Pd, Ni—Co—Pd, Co—Pd, Ni—Cr, Ni—Zn, Ni—Fe, Co—Zn, Ni—Cu, Co—Sn, Ni—P, Co—B, etc. The preferable thickness of the first intermediate coating is 0.1-5 μm for many practical applications, because the thickness of less than 0.1 μm can not display enough function of the first intermediate coating, that is, the effect for preventing the substrate to diffuse into the silver coating, and the function of the second intermediate coating. On the other hand, the thickness exceeding 5 μm is not economical, because it does not increase such functions.

The second intermediate coating is made of Sn, Cd, Pd, Ru or the alloys thereof and it prevents the first intermediate coating from being oxidized at high temperature. However, it is believed that the mechanism of preventing the oxidation at high temperature differs according as the second intermediate coating is made Sn or Cd or their alloy on the one hand or of Pd or Ru or their alloy on the other hand.

That is, because Sn and Cd are metals of low melting point and are soluble in silver, and have strong affinity with oxygen, it is considered that they diffuse rapidly into the silver coating to prevent oxygen from reaching the surface of the first intermediate coating by combining with oxygen which enters the silver coating from atmosphere or by depressing the rate of oxygen entry.

On the other hand, because Pd and Ru are metals of high melting point and are extremely poor in affinity with oxygen, it is considered that they become a barrier against oxygen which enter the silver coating from atmosphere to prevent oxygen from reaching the surface of the first intermediate coating.

The preferable thickness of the second intermediate coating is usually 0.01-2 μm on practical applications. The thickness of less than 0.01 μm does not show a remarkable effect to prevent oxygen from reaching the surface of the first intermediate coating, and the thickness exceeding 2 μm does not exhibit increased effect, so it is economically unfavorable.

Although Pd and Ru are precious metals belonging to plutinum metals group, they are comparatively low-priced noble metals, costing about ten times as much as silver in price thereof. Therefore, if the thickness of the silver coating can be greatly reduced by employing them in a thin film having such a thickness, particularly of 0.01–0.1 μm, another economical effect of reducing silver amount can be achieved.

As the second intermediate coating, as stated, not only Sn, Cd, Pd, or Ru alone but also the alloys thereof are effective, and sometimes the alloys are more effective.

Sn and Cd are active metals. Therefore, sometimes they partially dissolve out into electroplating bath, or they replace silver to dissolve out, at the time of electroplating silver thereon, and it causes lowering their adherence with the silver coating. In these cases, Sn—Pb, Sn—Bi, Sn—Cu, Sn—Ni, Sn—Zn, Sn—Co, Cd—Cu and other alloys are effective as the second intermediate coating.

On account of Pd and Ru being precious metals and high-priced, the cost can be reduced by employing Pd—Ni, Pd—Co, Pd—Ni—Co, or Ru—Ni alloy containing more than 40% of Pd.

Among metals employed as the second intermediate coating, Sn is particularly effective on practical applications, because it has less toxic than Cd and has an excellent reactivity with silver, but excessive thickness of Sn induces deterioration in function of the silver coating. Therefore, the desirable thickness of Sn is about 1/500–1/10 of that of the silver coating.

Because Ni, Co, Cr, Pd or the alloy thereof which constitutes the first intermediate coating of this invention is difficult to react with Sn or Cd which constitutes a part of the second intermediate coating, Sn or Cd of the second intermediate coating does not react with the substrate and stably diffuse into the silver coating, owing to existence of the first intermediate coating, so it can exhibit the oxygen-getter effect in the silver coating as stated above.

In case such first intermediate coating is not provided, Sn or Cd comes to react with copper constituting the substrate made of copper or copper alloy, and the effect of the second intermediate coating as beforementioned can not be obtained effectively.

The effect of the first intermediate coating which is aimed at exhibiting this function of the second intermediate coating is particularly effective when the first intermediate coating is made of Ni—Zn alloy.

As obvious from the above explanation, the intermediate coatings should be provided to the substrate in the order of the first intermediate coating and then the second intermediate coating.

As to the method of preparing said silver coated electric material of this invention, it is industrially possible to form each coating by mechanical cladding, adhering through evaporation and spattering, but electroplating process is most practical, because each of the first and second intermediate coatings and the silver coating can be effectively formed by the conventional electroplating process, and these three coatings are successively formed in that order.

Furthermore, the important point is to control each coating, particularly the thin layer like the second intermediate coating to the desired thickness. These controllings can be easily realized only by supplying electricity according to Faraday's law.

This invention is explained by examples as follows.

EXAMPLE 1

There is Ag-plated Cu wire (0.6 mm dia.) as a lead wire for diode. Si chip is soldered to a point of Cu wire subjected to headering with high Pb solder and cured with shielding resin to complete a diode. As the soldering and curing are done at 350° C. for 15 min. (in $H_2$) and at 215° C. for 10 hrs. (in atmosphere), respectively silver-coated lead wire is required to maintain solderability after treatments.

In this example, Cu wires of 0.6 mm dia. were subjected to usual electrolytic degreasing and then pickling, and thereafter subjected to electro-plating in the following electrolytic baths to obtain Ag plated Cu wires of various intermediate layers indicated in Table 1.

(a) Ni plating bath:
| | | |
|---|---|---|
| $NiSO_4$ | 250 g/l | pH 3.0 |
| $NiCl_2$ | 25 | 450° C. |
| $H_3BO_3$ | 30 | DK = 3.0 A/dm$^2$ |

(b) Ni-10% Co plating bath:
| | | |
|---|---|---|
| $NiSO_4$ | 240 g/l | |
| $NiCl_2$ | 40 | pH 3.0 |
| $CoSO_4$ | 20 | 45° C. |
| $H_3BO_3$ | 20 | DK = 2.5 A/dm$^2$ |

(c) Pd plating bath:
| | | |
|---|---|---|
| Pd (as P-salt) | | 10 g/l |
| $NHSO_3(NH_2)_2$ | | 100 |
| pH 7.5, 30° C. | | DK = 0.5 A/dm$^2$ |

(d) Pd-45% Ni plating bath:
PNP-50 ® by Nisshin Kasei Co. in Japan
| | | |
|---|---|---|
| Pd 10 g/l | | Ni 10 g/l |
| pH 5.0, 30° C. | | DK = 1 A/dm$^2$ |

(e) Pd-15% Ni plating bath:
PNP-80 ® by Nisshin Kasei Co. in Japan
| | | |
|---|---|---|
| Pd 20 g/l | | pH 8.9 |
| Ni 10 g/l | | 30° C. |
| | | DK = 0.5 A/dm$^2$ |

(f) Cr plating bath:
| | | |
|---|---|---|
| $CrO_3$ | 250 g/l | 40° C. |
| $H_2SO_4$ | 25 g/l | DK = 20 A/dm$^2$ |

(g) Sn plating bath:
| | | |
|---|---|---|
| $SnSO_4$ | 100 g/l | 15° C. |
| $H_2SO_4$ | 50 | DK = 1.5 A/dm$^2$ |
| Glue | 5 g/l | |
| β-naphthol | 5 g/l | |

(h) Sn-60% Cu plating bath:
| | | |
|---|---|---|
| CuCN | 15 g/l | 65° C. |
| $Na_2SnO_3$ | 100 | DK = 2.5 A/dm$^2$ |
| NaCN | 20 | |
| NaOH | 10 | |

(i) Cd plating bath:
| | | |
|---|---|---|
| $Cd(CN)_2$ | 35 g/l | 30° C. |
| NaCN | 100 | DK = 2.5 A/dm$^2$ |
| NaOH | 40 | |

(j) Ru plating bath:
Ruthenex ® by Tanaka Precious Metals Co. in Japan
| | |
|---|---|
| 65° C. | DK = 0.5 A/dm$^2$ |

(k) Ag-strike bath:
| | | |
|---|---|---|
| AgCN | 3 g/l | 20° C. |
| KCN | 30 | DK = 5 A/dm$^2$ × 5 sec. |

(l) Ag plating:
| | | |
|---|---|---|
| AgCN | 30 g/l | 20° C. |
| KCN | 45 | DK = 1.5 A/dm$^2$ |
| $K_2CO_3$ | 10 | |

The above Ag-plated Cu wires were subjected to the same conceccutive heating processes of 350° C. × 15 min. (in $H_2$) and of 215° C. × 10 hrs. (in atmosphere) as are done in the above diode manufacture, and then dipped into eutectic solder bath of 235° C. for 5 seconds according to MIL Standard. Thereafter, the percentages for the wetted areas of solder were measured as indicated in Table 1.

400° C.×5 min. and the latter supersonic welding must endure against that of 200° C.×15 min. in atmosphere.

Various Ag-plated lead frames of Table 2 were made according to the plating method of Example 1 and the below-mentioned plating method, and respective lead frames were subjected to the following tests.

TABLE 1

| Sample | No. | First intermediate layer Composition | First intermediate layer Thickness (μm) | Second intermediate layer Composition | Second intermediate layer Thickness (μm) | Ag-Coating Thickness (μm) | Wettability of Soldering (%) |
|---|---|---|---|---|---|---|---|
| Sample | 1 | Ni | 0.75 | Sn | 0.05 | 1.0 | 93 |
| of | 2 | " | " | Cd | " | " | 90 |
| this | 3 | " | " | Pd | 0.08 | " | 98 |
| Inven- | 4 | " | " | Ru | " | " | 95 |
| tion | 5 | " | " | Pd-45Ni | " | " | 95 |
|  | 6 | Ni-10Co | " | Pd-15Ni | 0.03 | " | 93 |
|  | 7 | " | " | Sn-60Cu | 0.05 | " | 95 |
|  | 8 | Pd | 0.1 | Sn | 0.01 | " | 95 |
|  | 9 | " | " | substituted by 1st intermediate layer |  | " | 90 |
|  | 10 | Pd-45Ni | " | Pd-15Ni | 0.06 | " | 97 |
|  | 11 | Cr | 0.25 | Sn | 0.03 | " | 93 |
|  | 12 | " | " | Pd | 0.05 | " | 95 |
|  | 13 | " | 0.1 | Cd | 0.02 | " | 90 |
| Conven- | 14 | — | — | — | — | 3.5 | 90 |
| tional | 15 | — | — | — | — | 1.0 | 15 |
| Sample | 16 | Ni | 0.75 | — | — | 3.5 | 40 |
|  | 17 | " | " | — | — | 1.0 | 10 |

As distinct from Table 1, Nos. 1–13 samples of this invention with a 1.0 μm-thick Ag coating passed 90% wettability, which is the minimum target of their solderability while Nos. 14 and 15 conventional samples barely attained 90% wettability with a 3.5 μm-thick Ag coating and Nos. 16 and 17 conventional samples had only 40% wet ratio even with a 3.5 μm-thick Ag coating.

Pd and Ru metals used for second intermediate layer are expensive, costing about 10 times as much as Ag. However, when Pd and Ru metals are used in a thickness of 0.08 μm for the second intermediate layer, Ag coating thickness can be reduced by 2.5 μm. Therefore, it is found that the use of Pd and Ru metals sufficiently pays.

EXAMPLE 2

Fe-14Cr alloy strip (0.32 mm thick) is used as a lead frame of semi-conductor and subjected to usual press forming to obtain 16-pin frame which is then Ag-plated overall in a thickness of 7 μm. In examples, the present invention was applied to reduce Ag plating thickness to 3.5 μm. Si intergrated circuit was soldered to a central tab portion of the lead frame and supersonic-welded to an inner lead portion of the frame with Au wire of 30 μm dia. by means of electrode on the element. The soldering must endure against a heating condition of Test I—Solderability Test:
After 400° C.×5 min. heating in the air, the lead frames were dipped into 350° C. bath of 95% Pb—5% Sn, and then their wetted area percentage were measured.

Test II—Bonding Strength Test:
The lead frames were heated at 400° C. for 5 min., cooled, and then heated at 200° C. for 15 min. The Au wire was given supersonic-welding under a bonding pressure of 45 gr. The average tensile strength of 20 samples was obtained.

Test III—Silver Migration Test:
Two lead portions cut from the lead frame were subjected to the above heating treatment and fixed on constant filter paper with 2 mm interval, and applied with DC voltage of 25 V at 60° C.×95% RH. After shelf test of 24 hrs, interpole resistance was measured.

Ni-15% Zn plating bath:

| $NiSO_4$ | 200 g/l | pH 3.0 |
| $ZnSO_4$ | 5 | 50° C. |
| $Na_2SO_4$ | 50 | DK = 2.5 A/dm² |
| $H_3BO_3$ | 30 | |

TABLE 2

| Sample | No. | First intermediate layer Composition | First intermediate layer Thickness (μm) | Second intermediate layer Composition | Second intermediate layer Thickness (μm) | Ag-Coating Thickness (μm) | Test I Wet area (%) | Test II Tensile strength gr. | Test III Interpole resist · MΩ |
|---|---|---|---|---|---|---|---|---|---|
| Sample | 1 | Ni | 0.1 | Sn | 0.01 | 3.5 | 90 | 10.2 | 5 |
| of this | 2 | " | " | " | 0.05 | " | 95 | 11.1 | 100 |
| Inven- | 3 | " | " | " | 0.1 | " | 93 | 10.0 | 100 |
| tion | 4 | " | " | " | 1.0 | " | 30 | 4.5 | 500 |
|  | 5 | Pd-45Ni | 0.1 | Pd-15Ni | 0.05 | " | 90 | 12.0 | 500 |
|  | 6 | " | " | Pd | 0.1 | " | 95 | 12.5 | 1,000 |
|  | 7 | " | " | Ru | 0.08 | " | 95 | 12.2 | 100 |
|  | 8 | Ni-15Zn | 0.1 | Sn | 0.01 | " | 93 | 11.0 | 100 |
| Conven- | 9 | — | — | — | — | " | 60 | 7.8 | <1 |
| tional Sample | 10 | — | — | — | — | 7 | 95 | 11.9 | <1 |

As distinct from Table 2, it is found that the lead frames Nos. 1–8 of this invention are all superior in metallurgical solderability (Test I and II) even with 3.5 μm-thick Ag-coating and have a high interpole resistance (Test III), with little danger of silver migration.

On the other hand, the conventional lead frame No. 9 is not sufficient in solderability and has much danger of silver migration. Further, the conventional lead frame No. 10 is in danger of silver migration while it is good in solderability.

EXAMPLE 3

As spring contact for key board switch, phosphorous bronze strip (0.08t, Sn=8.0%) with a 0.5 μm-thick Ag-plating was used. For applying the strip to samples of this invention, the plating methods of Examples 1 and 2, and the below-mentioned plating method were used to make various samples of Table 3. These contacts were subjected to the aging treatments under the following two conditions in order to confirm a long performance as contact and measured for contact resistance.

The measurement was carried out by pushing an Ag rod probe with semi-sphere shape (R=4.0 mm) to the spring contact under a 75 gr. load and applying a current of 100 mA. The results were indicated in Table 3.

Aging I:
Kept in humidity chamber of 60° C. and relative humidity 95% for 1,000 hrs.

Aging II:
Treated in atmosphere of 200° C. for 10 hrs.

Co plating bath:

| $CoSO_4$ | 400 g/l | pH 3.5 |
|---|---|---|
| NaCl | 25 | 50° C. |
| $H_3OB_4$ | 45 | DK = 1.0 A/dm$^2$ |

TABLE 3

| Sample | No. | First intermediate layer Composition | First intermediate layer Thickness (μm) | Second intermediate layer Composition | Second intermediate layer Thickness (μm) | Ag-Coating Thickness (μm) | Aging I later contact resistance (mΩ) | Aging II later contact resistance (mΩ) |
|---|---|---|---|---|---|---|---|---|
| Sample | 1 | Ni | 0.25 | Sn | 0.02 | 0.5 | 9.2 | 10.0 |
| of | 2 | Co | " | " | " | " | 7.9 | 1.5 |
| this | 3 | Pd-45Ni | " | " | 0.01 | " | 5.0 | 7.8 |
| Invention | 4 | " | " | Pd-15Ni | 0.02 | " | 4.5 | 4.7 |
| Conventional | 5 | — | — | — | — | " | 39.0 | >100.0 |
| Sample | 6 | Ni | 0.25 | — | — | " | 13.0 | 18.0 |

As distinct from Table 3, it is found that spring contacts given an Ag-coating of this invention are small in contact resistance or reduced in deterioration of contact resistance in comparison with the conventional ones.

Further, in Example 3, the surfaces of the spring contacts subjected to the aging treatment I were performed on analysis for the corrosive products by the cathodic reduction and resulted in detecting Cu oxide and Ag sulfide. Quantities of electricity necessary for the reduction are indicated in Table 4.

TABLE 4

| Sample | No. | Quantity of electricity for reduction coulomb/cm$^2$ |
|---|---|---|
| Sample of this Invention | 1 | 9.1 × 10$^{-3}$ |
| | 2 | 9.2 × 10$^{-3}$ |
| | 3 | 11.0 × 10$^{-3}$ |
| | 4 | 14.0 × 10$^{-3}$ |
| Conventional Sample | 5 | 32.0 × 10$^{-3}$ |
| | 6 | 15.0 × 10$^{-3}$ |

In other words, the surfaces of the spring contacts with Ag coating of this invention make less corrosion product than the conventional samples. This is particularly so in the case of Nos. 1, 2 and 3 samples using Sn in the second intermediate layer. It is presumed that a very small quantity of Sn was dispersed into the Ag coating to form an alloy, thereby improving corrosion-resistance of the Ag coating.

As mentioned above, the Ag-coated electric materials of this invention are superior in metallurgical solderability, electric connection and corrosion resistance, and also high in manufacturing precision and easy to obtain an efficient Ag-coating, thereby providing a conspicuous effect to the electric and electronic industries.

We claim:

1. An electroconductive or non-electroconductive substrate partially or totally coated with silver or a silver alloy, having between said silver or silver alloy and said substrate two intermediate coating layers which comprise (1) a first intermediate layer, as a barrier layer, adjacent to said substrate layer, consisting of at least one metal selected from the group consisting of Ni, Co, Cr, Pd and alloys thereof, having a thickness of 0.1–5 μm and (2) a second intermediate layer, as an anti-oxidant layer, between said first intermediate layer and said silver or silver alloy, consisting of at least one metal selected from the group consisting of Sn, Cd, Pd, Ru or alloys thereof, having a thickness of 0.01–2 μm.

2. The substrate of claim 1, where said substrate also serves as the first intermediate coating, when the substrate is Ni, Co, Cr, Pd or alloys thereof, and when the coating of Ni, Co, Cr, Pd or alloys thereof is coated on the surface of the substrate.

3. The substrate of claim 1, wherein said first intermediate coating is made of an alloy containing not lower than 10 wt. % of a metal selected from the group consisting of Ni, Co, Cr and Pd.

4. The substrate of claim 1, wherein the second intermediate coating is made of Sn or an alloy of Sn.

5. The substrate of claim 1, wherein the second intermediate coating is made of Sn and the thickness is 1/500 to 1/10 of that of the silver coating.

6. The substrate of claim 1, wherein the first intermediate coating is a Ni-Zn alloy.

7. The substrate of claim 1, wherein said substrate is made of Cu or an alloy of Cu.

* * * * *